United States Patent
Huang

(10) Patent No.: US 7,521,285 B2
(45) Date of Patent: Apr. 21, 2009

(54) METHOD FOR FABRICATING CHIP-STACKED SEMICONDUCTOR PACKAGE

(75) Inventor: Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 20 days.

(21) Appl. No.: 11/904,744

(22) Filed: Sep. 27, 2007

(65) Prior Publication Data
US 2008/0032450 A1  Feb. 7, 2008

Related U.S. Application Data

(62) Division of application No. 11/138,821, filed on May 25, 2005, now Pat. No. 7,315,078.

(30) Foreign Application Priority Data
Feb. 2, 2005 (TW) ............................... 94103165 A

(51) Int. Cl.
*H01L 21/00* (2006.01)
(52) U.S. Cl. ...................................... 438/106
(58) Field of Classification Search ................. None
See application file for complete search history.

(56) References Cited
U.S. PATENT DOCUMENTS

| | | | |
|---|---|---|---|
| 5,222,014 A * | 6/1993 | Lin | ............... 361/792 |
| 5,815,372 A | 9/1998 | Gallas | |
| 5,870,289 A | 2/1999 | Tokuda et al. | |
| 5,943,213 A | 8/1999 | Sasov | |
| 6,441,476 B1 | 8/2002 | Emoto | |
| 6,462,405 B1 | 10/2002 | Lai et al. | |
| 6,472,741 B1 | 10/2002 | Chen et al. | |
| 6,472,743 B2 | 10/2002 | Huang et al. | |
| 6,646,335 B2 | 11/2003 | Emoto | |
| 6,980,438 B2 | 12/2005 | Huang et al. | |
| 2002/0180022 A1 | 12/2002 | Emoto | |
| 2004/0212080 A1 | 10/2004 | Chen et al. | |
| 2004/0238857 A1 * | 12/2004 | Beroz et al. | ............... 257/232 |
| 2005/0036291 A1 | 2/2005 | Huang et al. | |
| 2006/0172457 A1 | 8/2006 | Huang | |
| 2007/0072339 A1 | 3/2007 | Chen et al. | |

* cited by examiner

*Primary Examiner*—Charles D. Garber
*Assistant Examiner*—Andre' C Stevenson
(74) *Attorney, Agent, or Firm*—Peter F. Corless; Steven M. Jensen; Edwards Angell Palmer & Dodge LLP

(57) ABSTRACT

A chip-stacked semiconductor package and a method for fabricating the same are proposed. A chip carrier module plate including a plurality of chip carriers, and a heat sink module plate including a plurality of heat sinks are provided, wherein a plurality of through holes are formed around each of the heat sinks. First chips, the heat sink module plate, and second chips are successively stacked on the chip carrier module plate, wherein the second chips are electrically connected to the chip carrier module plate by conductive wires penetrating the through holes of the heat sink module plate. After a molding process is completed, a singulation process can be performed to separate the chip carriers and the heat sinks, and thus individual semiconductor packages for integrating the heat sinks with the stacked chips are fabricated.

11 Claims, 10 Drawing Sheets

METHOD FOR FABRICATING CHIP-STACKED SEMICONDUCTOR PACKAGE

CROSS-REFERENCE TO RELATED APPLICATION(S)

This application is a divisional of copending application U.S. Ser. No. 11/138,821, filed on May 25, 2005.

FIELD OF THE INVENTION

The present invention relates to chip-stacked semiconductor packages and methods for fabricating the same, and more particularly, to a chip-stacked semiconductor package for integrating a heat sink with stacked chips, and a method for fabricating the semiconductor package.

BACKGROUND OF THE INVENTION

The tremendous advancement of electronic industry leads electronic products to develop with multi-functionality and high performances to satisfy the packaging requirements such as high integration and miniaturization for semiconductor packages. In order to improve the performance and capacity of a single semiconductor package for use in a miniaturized electronic product with large capacity and high speed, the semiconductor package is conventionally made in the form of a MCM (multi chip module), which can reduce the overall volume and improve the electrical performance of the package and thus becomes a primary type of package in the industry. In the MCM structure, at least two semiconductor chips are mounted on a chip carrier and each of the chips is stacked on the chip carrier in a vertical manner.

A conventional chip-stacked structure allows a lower chip to be electrically coupled to a substrate by a flip-chip technique, and an upper chip to be electrically coupled to the substrate by a wire-bonding technique. Such packaging technology is disclosed in U.S. Pat. Nos. 5,815,372 and 6,462,405 shown in FIGS. 1 and 2 respectively, and is briefly described as follows.

FIG. 1 shows a conventional stacked-type ball grid array (BGA) chip package structure. As shown, this chip package structure includes: a substrate 100 having a front surface 100a and a back surface 100b; a first chip 110 having an active surface 110a and a non-active surface 110b, wherein the active surface 110a of the first chip 110 is electrically coupled to the front surface 100a of the substrate 100 by solder bumps 111 in a flip-chip manner; a second chip 120 having an active surface 120a and a non-active surface 120b, wherein the non-active surface 120b of the second chip 120 is attached to the non-active surface 110b of the first chip 110 by an adhesive layer 121; a plurality of conductive wires 140 formed from the active surface 120a of the second chip 120 to the front surface 100a of the substrate 100, for electrically coupling the second chip 120 to the substrate 100; an encapsulant 150 for encapsulating the two stacked chips 110, 120; and a ball grid array 160 implanted on the back surface 100b of the substrate 100, for serving as external electrical contacts of the package unit.

However, the foregoing stacked-type BGA chip package structure has a drawback that a large amount of heat is produced along with the operation of the highly integrated chips, and the encapsulant for encapsulating the chips is made of a poor thermally conductive resin material with a coefficient of thermal conductivity of only 0.8 w/m–k, thereby resulting in unsatisfactory heat dissipating efficiency and affecting the performances and lifetime of the chips. In other words, as there is no heat dissipating structure provided for the packaged chips 110, 120, the heat produced during practical operation of the chips 110, 120 is accumulated between the chips 110, 120, and the heat produced by the lower chip 110 is transferred to the upper chip 120, making the upper chip 120 easier to be damaged by thermal stress.

FIG. 2 shows a conventional stacked-type BGA chip package structure with a heat dissipating structure. As shown, this chip package structure is substantially the same as that shown in FIG. 1, with a primary difference in that a heat sink 230 is provided on the substrate 100 to enhance the heat dissipating efficiency of the package structure. The heat sink 230 comprises a supporting portion 231 and a top portion 232, wherein the supporting portion 231 is supported on the front surface 100a of the substrate 100, and the top portion 232 is disposed above the upper chip 120. By this arrangement, the heat produced during the practical operation of the chips 110, 120 is firstly transferred to the resin material located between the second chip 120 and the heat sink 230 and then dissipated out of the package structure by the heat sink 230. Therefore, the package structure shown in FIG. 2 has better heat dissipating efficiency than that shown in FIG. 1.

However, in practical implementation, as the heat sink 230 of the package structure shown in FIG. 2 is not directly in contact with the non-active surfaces 110b, 120b of the two chips 110, 120, the heat produced by the chips 110, 120 must be transferred through the resin material with poor thermal conductivity to the heat sink 230, thereby not able to provide satisfactory heat dissipating efficiency.

Referring to FIG. 3, in view of the drawbacks in the foregoing conventional technology, U.S. Pat. No. 6,472,741 discloses a thermally enhanced stacked-type BGA chip package structure, comprising: a substrate 300 having a front surface 300a and a back surface 300b; a first chip 310 having an active surface 310a and a non-active surface 310b, wherein the active surface 310a of the first chip 310 is electrically coupled to the front surface 300a of the substrate 300 in a flip-chip manner; a heat sink 338 comprising a supporting portion 330, a top portion 337 and a bottom portion 339, wherein at least one wire-routing hole 336 is formed in the top portion 337, the supporting portion 330 of the heat sink 338 is mounted on the front surface 300a of the substrate 300, and the bottom portion 339 is attached to the non-active surface 310b of the first chip 310 in a thermally conductive manner; a second chip 320 having an active surface 320a and a non-active surface 320b, wherein the non-active surface 320b of the second chip 320 is attached to the top portion 337 of the heat sink 338 in a thermally conductive manner; a plurality of conductive wires 340 formed from the active surface 320a of the second chip 320, through the wire-routing hole 336 in the top portion 337 of the heat sink 338, to the front surface 300a of the substrate 300, for electrically coupling the second chip 320 to the substrate 300; an encapsulant 350 for encapsulating the front surface 300a of the substrate 300, the first chip 310, the heat sink 338, the second chip 320 and the conductive wires 340; and a plurality of solder balls 360 implanted on the back surface 300b of the substrate 300. By direct contact of the top portion 337 and the bottom portion 339 of the heat sink 338 with the non-active surfaces 320b, 310b of the two chips 320, 310 respectively, better heat dissipating efficiency can be achieved by this package structure as compared to the conventional technology shown in FIG. 2.

In line with the requirements such as compact profiles and high performances for the electronic products, the semiconductor package structure is correspondingly sized smaller and smaller, such that a CSP (Chip Scale Package) structure e.g. a TFBGA (Thin and Fine-Pitch Ball Grid Array) package is developed and becomes widely demanded. However in the CSP structure, since the substrate has a size nearly equal to the size of the chip and the area for bonding the conductive wires is limited to a portion between the chip attach area and edges of the substrate, there is no space on the substrate available for receiving a supporting portion of a heat sink. Under this situation, the heat sink with the supporting portion used in the foregoing U.S. Pat. No. 6,472,741 cannot be applied to the CSP structure or a substrate with a high-density circuit layout. Moreover, to accommodate the supporting portion of the heat sink on the substrate also causes a trouble in the manufacture of the substrate.

Accordingly, U.S. Pat. No. 6,472,743 discloses a package structure with solder balls being provided at corners of a substrate to serve as supporting portions for a heat sink. However, this arrangement requires corresponding modification of the substrate structure, and also easily causes slanting of the heat sink mounted on the solder balls due to difficulty in controlling the height of the solder balls. The slanted heat sink may possibly come into contact with signal wires of the chip and thereby results in a short-circuiting problem. This as a result leads to inconvenience in the fabrication processes, degraded reliability and increased costs. And similarly, to accommodate the supporting portions (solder balls) for the heat sink on the substrate causes a trouble in the manufacture of the substrate.

Further in the foregoing semiconductor packages, the attachment between the heat sink and the chip needs to be precisely controlled to avoid slanting of the heat sink, such that a batch-type method cannot be used to attach heat sinks to chips. That is, the heat sinks must be adhered to the corresponding chips one by one, thereby increasing the complexity and time of the overall packaging processes, which is undesirable for reducing the packaging costs and improving the packaging efficiency.

SUMMARY OF THE INVENTION

In light of the foregoing drawbacks in the conventional technology, an objective of the present invention is to provide a chip-stacked semiconductor package and a method for fabricating the same, which can effectively integrate a heat dissipating structure in the multi-chip semiconductor package to thereby improve the heat dissipating efficiency.

Another objective of the present invention is to provide a chip-stacked semiconductor package and a method for fabricating the same, which can effectively integrate a heat dissipating structure in the multi-chip semiconductor package, without having a concern of area limitation in a CSP structure.

Still another objective of the present invention is to provide a chip-stacked semiconductor package and a method for fabricating the same, which can improve the heat dissipating efficiency and electrical quality of the multi-chip semiconductor package.

A further objective of the present invention is to provide a chip-stacked semiconductor package and a method for fabricating the same, wherein a heat dissipating structure is integrated in the semiconductor package, without having to be supported on a substrate.

A further objective of the present invention is to provide a chip-stacked semiconductor package and a method for fabricating the same, wherein a heat dissipating structure is integrated in the semiconductor package without causing slanting of the heat dissipating structure, thereby improving the yields of fabricated products.

A further objective of the present invention is to provide a chip-stacked semiconductor package and a method for fabricating the same, wherein chips and heat dissipating structures are integrated in a batch-type manner, which can reduce the complexity and time of the overall packaging processes, thereby decreasing the packaging costs and improving the packaging efficiency.

In accordance with the above and other objectives, the present invention proposes a method for fabricating chip-stacked semiconductor packages comprising the steps of: preparing a chip carrier module plate including a plurality of chip carriers; mounting a first chip on a predetermined position of each of the chip carriers, and electrically connecting the first chips to the chip carriers; providing a heat sink module plate including a plurality of heat sinks, the heat sinks corresponding in size to the chip carriers, wherein a plurality of through holes are formed around each of the heat sinks, and each of the heat sinks is correspondingly attached to each of the first chips; mounting a second chip on each of the heat sinks, and electrically connecting the second chips to the chip carriers via conductive wires penetrating the through holes formed in the heat sink module plate; performing a molding process to form an encapsulant for completely encapsulating the first chips, the second chips and the heat sink module plate on the chip carrier module plate; and performing a singulation process to cut along edges of the chip carriers and the heat sinks so as to form chip-stacked semiconductor packages integrated with the heat sinks.

The first chip can be attached and electrically connected via its active surface to the chip carrier in a flip-chip manner, such that the heat sink is directly mounted on a non-active surface of the first chip. Alternatively, the first chip can be mounted via its non-active surface on the chip carrier, and is electrically connected to the chip carrier by a wire-bonding technique, such that the heat sink is attached to the active surface of the first chip by a buffer pad interposed therebetween without affecting a wire-bonding area of the active surface of the first chip. The chip carrier can be a substrate. A surface portion of the heat sink in contact with the encapsulant can be subjected to a blacking or browning treatment to improve adhesion between the heat sink and the encapsulant.

By the foregoing fabrication processes, the present invention also proposes a chip-stacked semiconductor package comprising: a chip carrier; a first chip mounted on and electrically connected to the chip carrier; a heat sink formed with a plurality of through holes and attached to the first chip, wherein the heat sink is free of being in contact with the chip carrier; a second chip mounted on the heat sink, wherein the second chip is electrically connected to the chip carrier via conductive wires penetrating the through holes formed in the heat sink; and an encapsulant formed on the chip carrier, for encapsulating the first chip, the second chip, the conductive wires and the heat sink, wherein a side portion of the heat sink is exposed from the encapsulant. The first chip can be electrically connected to the chip carrier by a flip-chip technique or a wire-bonding technique. In the case of utilizing the flip-chip technique to electrically connect the first chip to the chip carrier, the heat sink is directly attached to a non-active surface of the first chip. Alternatively, in the case of utilizing the wire-bonding technique to electrically connect the first chip to the chip carrier, a buffer pad with a CTE (Coefficient of Thermal Expansion) substantially equal to that of the first chip can be firstly attached to an active surface of the first chip at a position not affecting the bonding of the conductive wires, and then the heat sink is attached to the buffer pad. The arrangement of not directly attaching the heat sink to the first chip can prevent the heat sink from touching the conductive wires and reduce thermal stress generated from the heat sink to the first chip caused by mismatch in CTE therebetween.

In one embodiment of the present invention, the chip carrier is a TFBGA substrate, wherein a plurality of solder balls are implanted on a bottom surface of the substrate to serve as intermediates for electrically connecting the chips to an external device.

In another embodiment of the present invention, the chip carrier is a LGA (Land Grid Array) substrate, wherein the chips are electrically connected to an external device by a plurality of metal contacts provided on a bottom surface of the substrate.

It should be particularly noted that, in the semiconductor package and the fabrication method thereof according to the present invention, the selection of chip carrier and the electrical connection manner between the chips and the chip carrier may have various combinations and variations, which are all covered by the scope of the present invention.

Therefore, according to the semiconductor package and the fabrication method thereof provided by the present invention, the heat sink can be directly attached to the first chip via an adhesive layer, such that the heat sink does not require a supporting portion to be attached to the substrate and undesirably occupy space on the substrate, thereby suitable for fabricating a CSP structure. Moreover, a batch-type fabrication technology is employed in the present invention, which uses a chip carrier module plate including a plurality of chip carriers and a heat sink module plate including a plurality of heat sinks with through holes being formed around each of the heat sinks, wherein the through holes formed in the adjacent heat sinks can communicate with each other, such that first chips, the heat sink module plate, and second chips are successively mounted on the chip carrier module plate, wherein the second chips are electrically connected to the chip carrier module plate via conductive wires penetrating the through holes of the heat sink module plate. After a molding process is complete, a singulation process is performed to cut along edges of the chip carriers and the heat sinks, and a cutting tool is moved to pass through the through holes of the heat sink module plate, so as to form a plurality of chip-stacked semiconductor packages integrated with heat sinks. Further since the cutting tool is moved to pass through the through holes of the heat sink module plate, excessive wearing of the cutting tool can be avoided, which is advantageous for performing the singulation process and controlling the singulation cost and also facilitates mass production of the semiconductor packages.

BRIEF DESCRIPTION OF THE DRAWINGS

The present invention can be more fully understood by reading the following detailed description of the preferred embodiments, with reference made to the accompanying drawings, wherein:

FIG. 4E' is a top view of FIG. 4E, showing that a second chip mounted on a heat sink is electrically connected to a substrate by conductive wires penetrating through holes of a heat sink module plate;

DETAILED DESCRIPTION OF THE PREFERRED EMBODIMENTS

First Embodiment

FIGS. 4A to 4H show steps of a method for fabricating chip-stacked semiconductor packages according to a first embodiment of the present invention.

Figure 1:
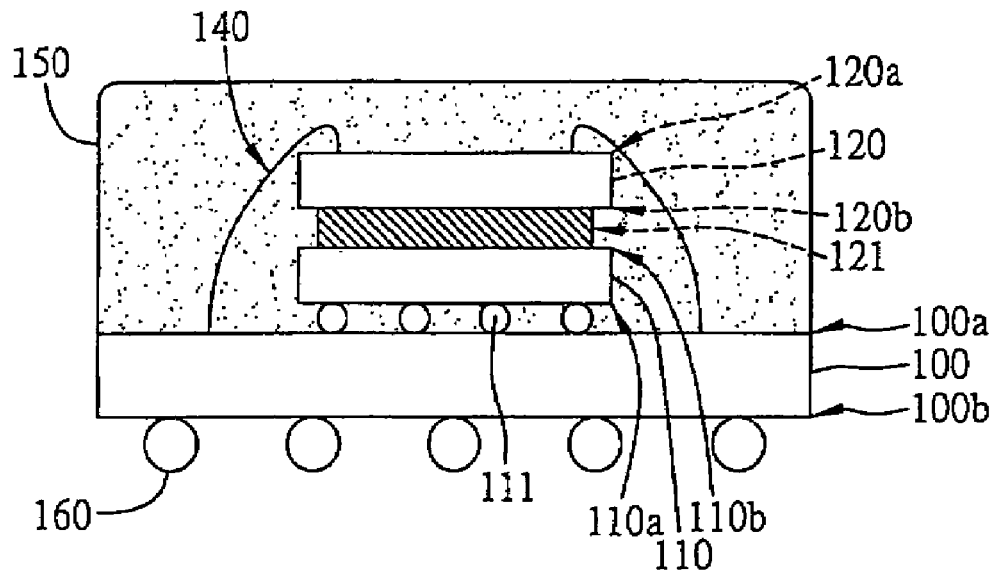
FIG. 1 (PRIOR ART) is a cross-sectional view showing a conventional stacked-type BGA chip package structure.
Figure 2:
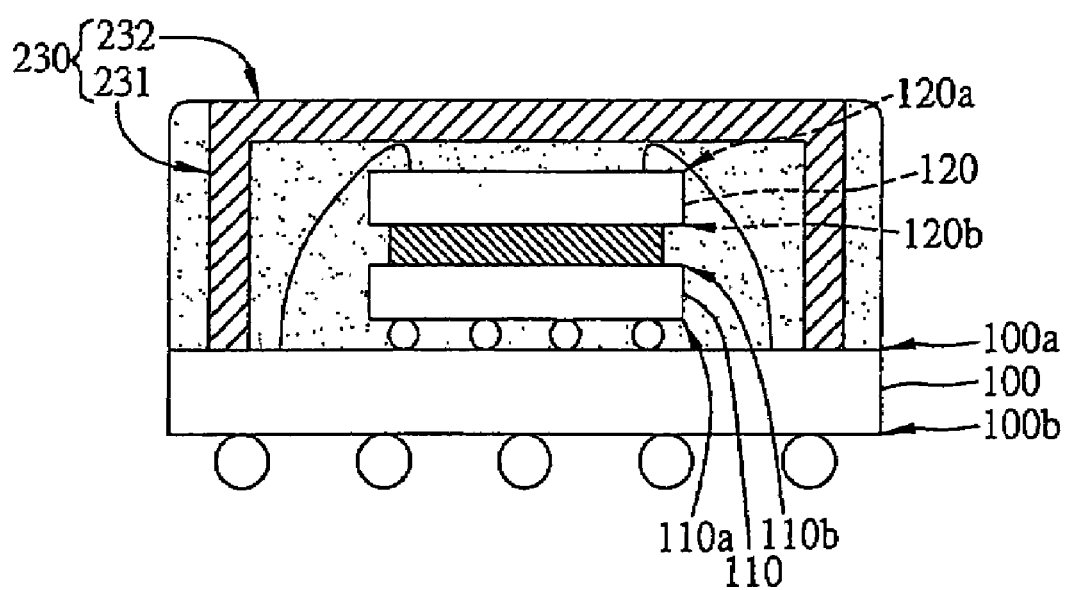
FIG. 2 (PRIOR ART) is a cross-sectional view showing a conventional stacked-type BGA chip package structure with a heat dissipating structure.
Figure 3:
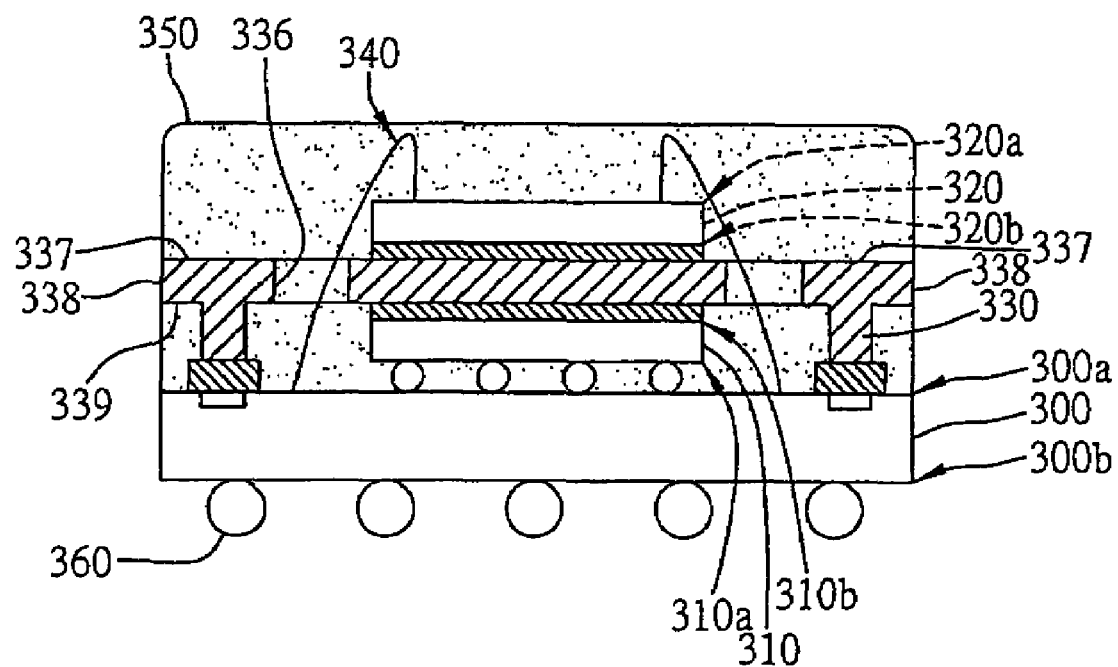
FIG. 3 (PRIOR ART) is a cross-sectional view of a semiconductor package disclosed by U.S. Pat. No. 6,472,741.
Figure 4A:
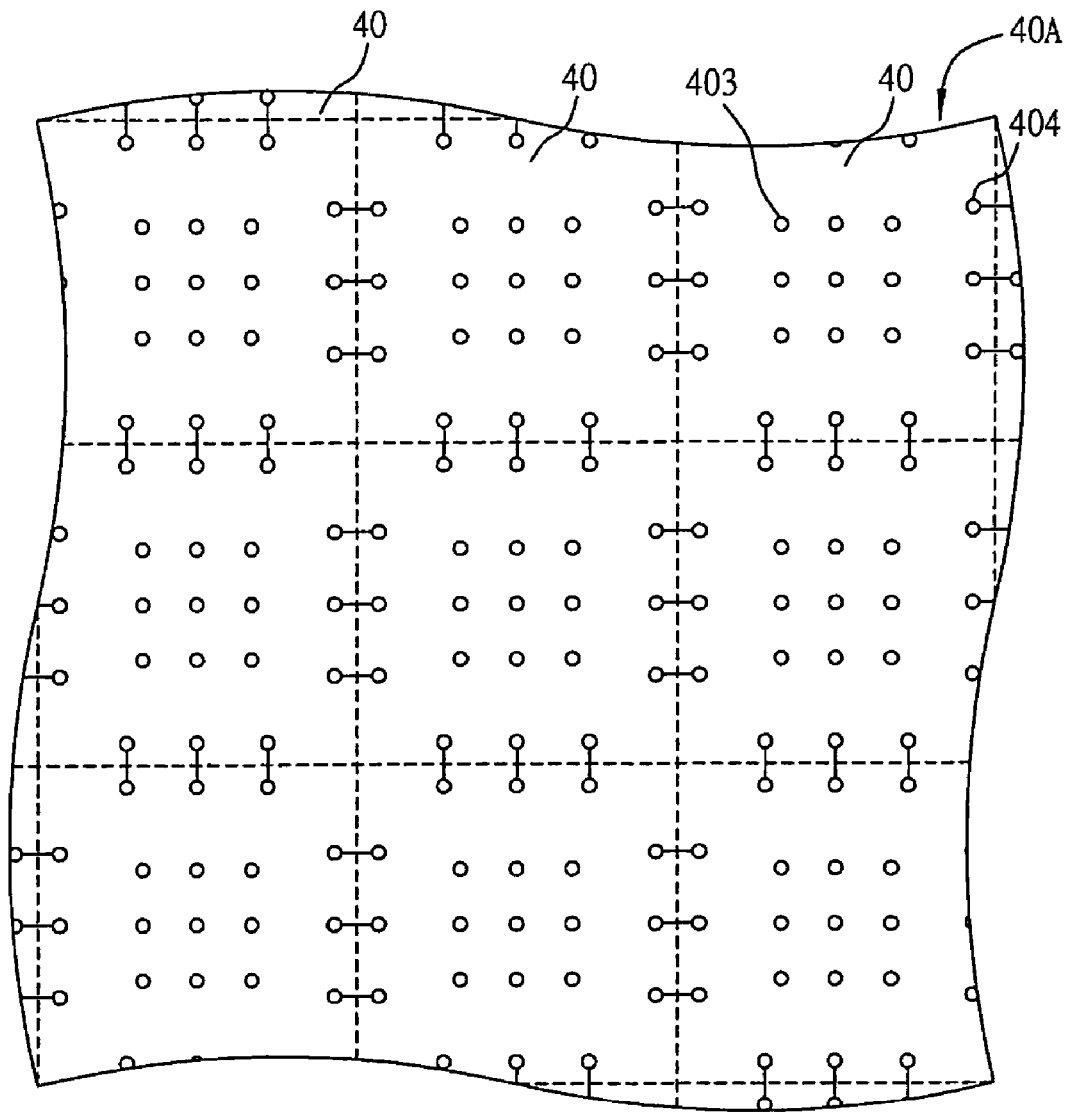
FIGS. 4A to 4H are cross-sectional views showing steps of a method for fabricating chip-stacked semiconductor packages according to a first embodiment of the present invention.
Figure 4B:
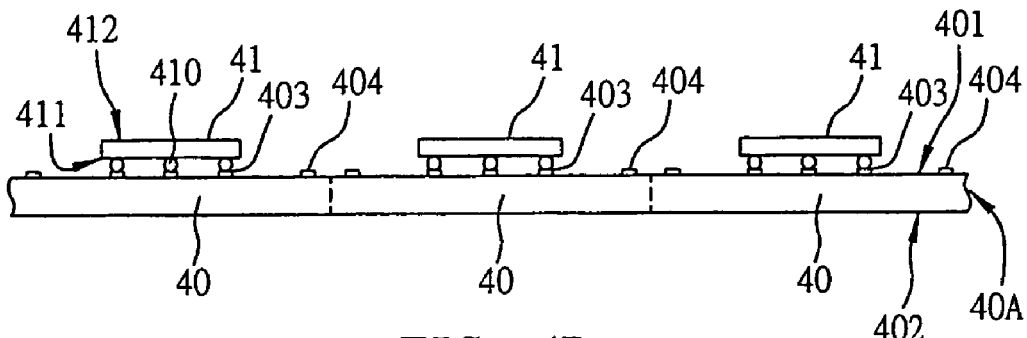

Referring to FIGS. 4A and 4B, firstly, a chip carrier module plate such as a substrate module plate 40A is provided, which includes a plurality of chip carriers such as substrates 40 arranged in an array. Each of the substrates 40 has a first surface 401 and a second surface 402 opposed to the first surface 401. A plurality of first bond pads 403 and second bond pads 404 are formed on the first surface 401 of each of the substrates 40. The first bond pads 403 are located at a central portion of the first surface 401 of each of the substrates 40, such that a first chip 41 is attached and electrically connected to the first bond pads 403 of each of the substrates 40 in a flip-chip manner. The second bond pads 404 are located at a peripheral portion of the first surface 401 of each of the substrates 40 to subsequently allow a second chip (not shown) to be electrically connected to the second bond pads 404 of the substrate 40 by a wire-bonding technique. The first chip 41 has an active surface 411 and a non-active surface 412. The active surface 411 of the first chip 41 is electrically connected to the first bond pads 403 formed on the first surface 401 of the substrate 40 by a conductive material 410 in the flip-chip manner. It should be noted that, in addition to an array, the substrates 40 can also be arranged in a strip, or single substrates can be adopted under appropriate fabrication conditions.

Figure 4C:
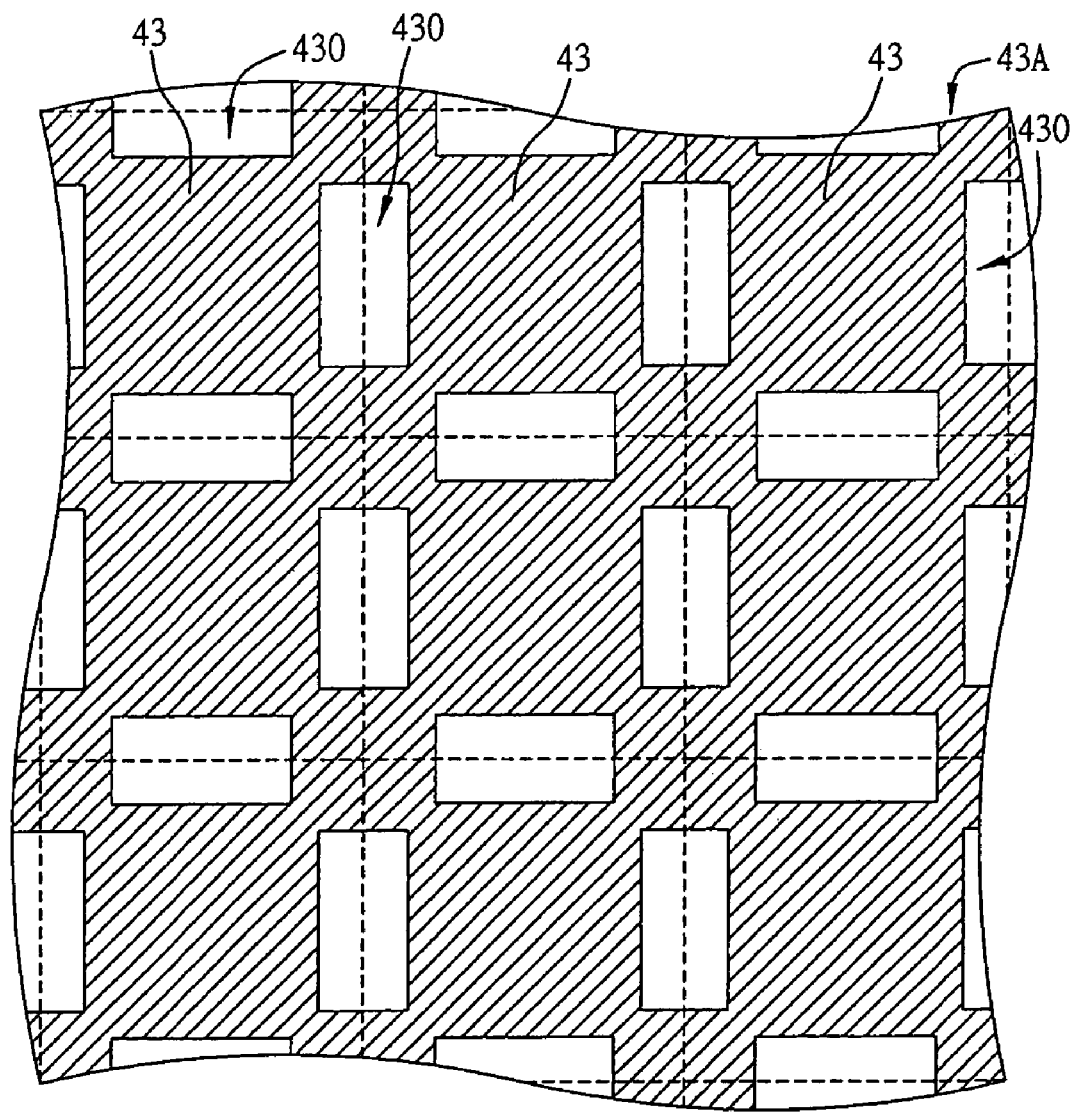
Figure 4D:
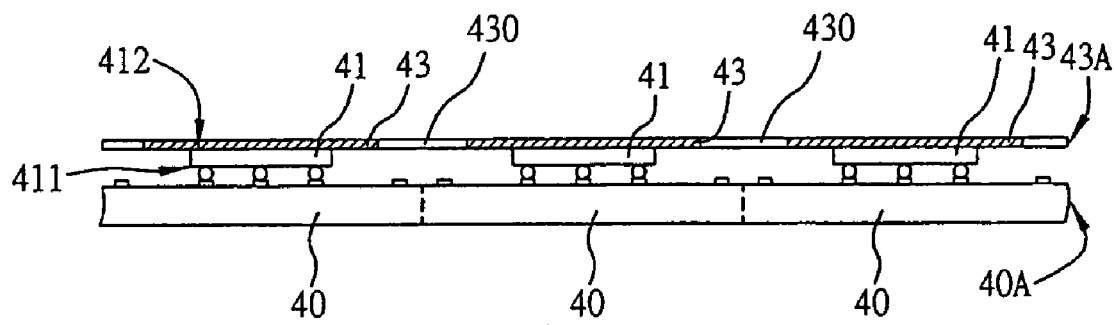

Referring to FIGS. 4C and 4D, a heat sink module plate 43A including a plurality of heat sinks 43 is provided, wherein the heat sinks 43 correspond in size to the substrates 40. A plurality of through holes 430 are formed around each of the heat sinks 43. Each of the heat sinks 43 is attached to the non-active surface 412 of each of the first chips 41 by a thermally conductive adhesive layer (not shown). The heat sink module plate 43A can be subjected to a blacking or browning treatment to improve adhesion between the heat sinks and a subsequent encapsulant. The through holes 430 formed in the adjacent heat sinks 43 communicate with each other, such that wearing of a cutting tool can be reduced during a subsequent singulation process for separating the heat sinks from each other.

Figure 4E:
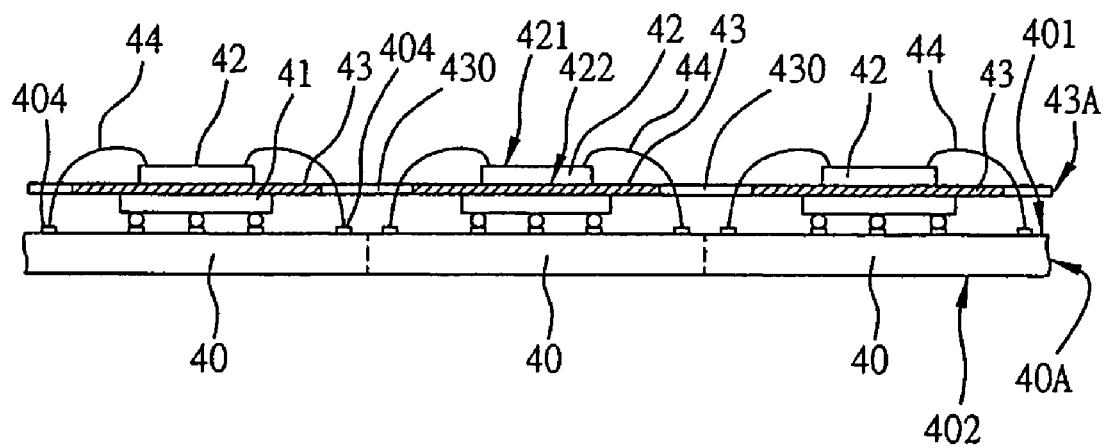
Figure 4E:
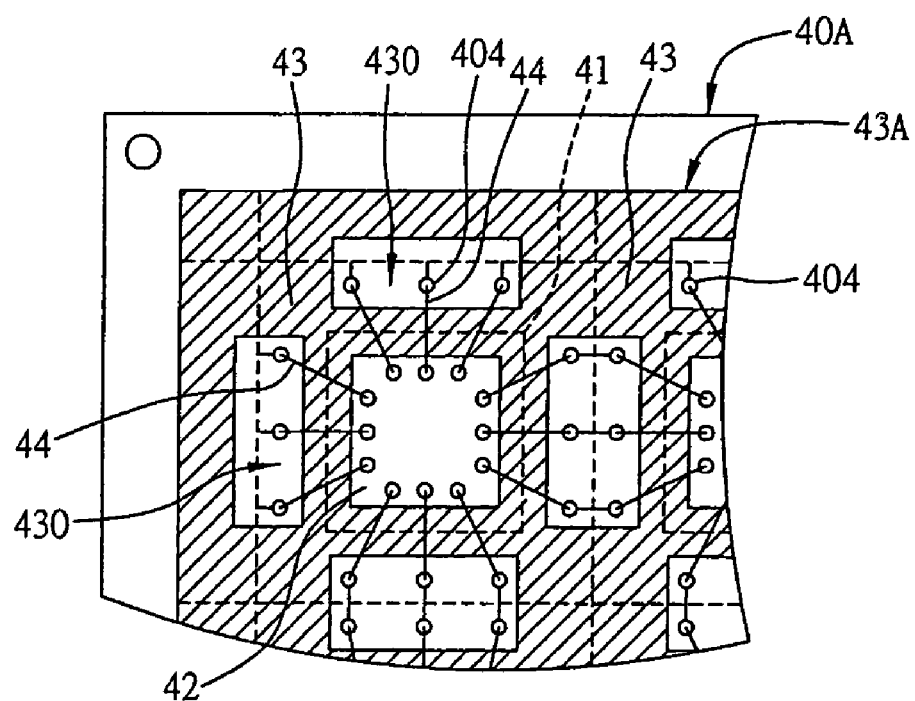

As shown in FIG. 4E, a second chip 42 is mounted on each of the heat sinks 43, and is electrically connected to the corresponding substrate 40 via conductive wires 44 penetrating the through holes 430 of the heat sink module plate 43A.

The second chip 42 has an active surface 421 and a non-active surface 422. The non-active surface 422 of the second chip 42 is attached to the corresponding heat sink 43, and the active surface 421 of the second chip 42 is electrically connected to the second bond pads 404 on the first surface 401 of the substrate 40 via the conductive wires 44 penetrating the through holes 430 of the heat sink module plate 43A.

FIG. 4E', which is a top view of FIG. 4E, shows the above arrangement that the second chip 42 is mounted on the heat sink 43 and is electrically connected to the second bond pads 404 of the substrate 40 by the conductive wires 44 penetrating the through holes 403 of the heat sink module plate 43A.

Figure 4F:
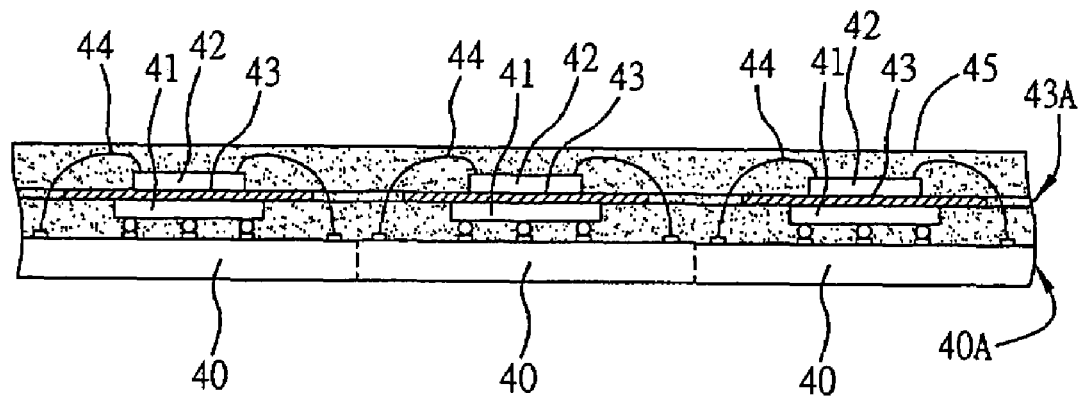

Referring to FIG. 4F, a molding process is performed to form an encapsulant 45 that completely encapsulates the first chips 41, the second chips 42 and the heat sink module plate 43A on the substrate module plate 40A. In other words, an integrated structure of the heat sink module plate 43A, the first chips 41, the second chips 42 and the substrate module plate 40A is placed into a molding cavity of an encapsulation mold (not shown) and subjected to the molding process, such that the encapsulant 45 for encapsulating the heat sink module plate 43A, the first chips 41, the second chips 42 and the conductive wires 44 is fabricated.

Figure 4G:
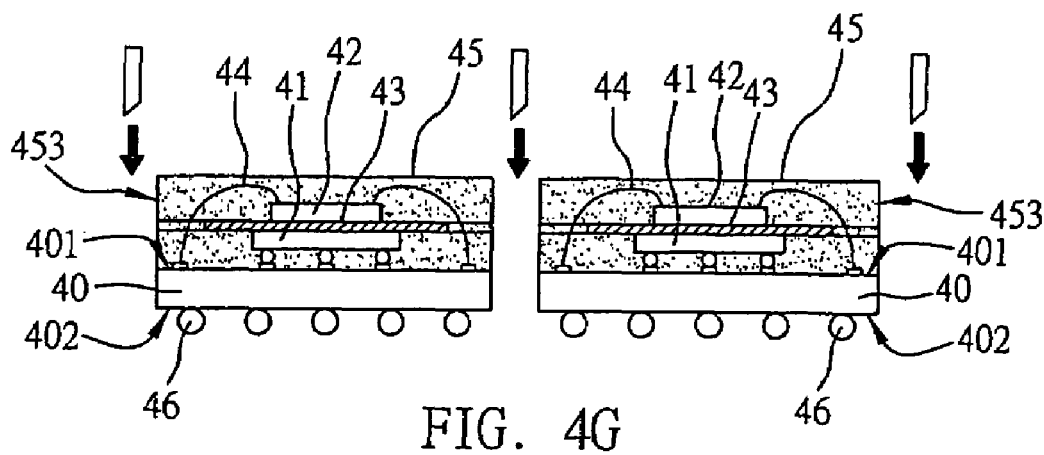
Figure 4H:
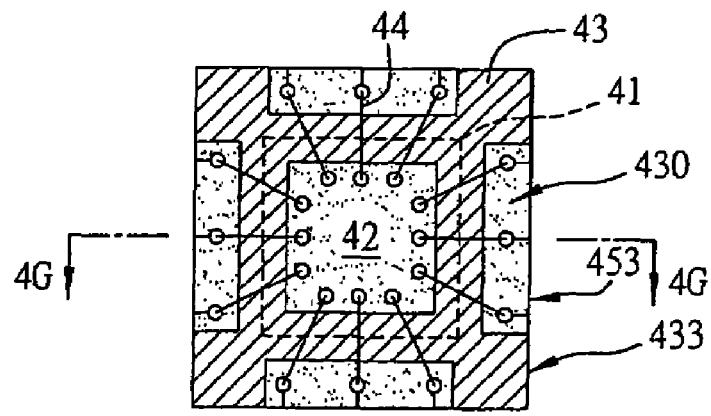

Referring to FIG. 4G, a singulation process is performed using a cutting tool to cut along edges of the substrates 40 and the heat sinks 43 to thereby form a plurality of chip-stacked semiconductor packages integrated with heat sinks (as shown in FIG. 4H). Since the cutting tool is primarily moved to pass through the through holes 430 of the heat sink module plate 43A during the singulation process (the through holes 430 formed in the adjacent heat sinks 43 communicate with each other), wearing of the cutting tool can be reduced and cutting burrs are not easily caused, thereby advantageous for performing the singulation process and controlling the singulation cost and also fabricating the mass production of package structures. Moreover, a plurality of conductive elements 46 such as solder balls can be implanted on the second surface 402 of each of the substrates 40 of the substrate module plate 40A, such that electrical connection between the chips 41, 42 and an external device can be established via the conductive elements 46. A jig (not shown) can be used to adsorb and hold in vacuum the semi-fabricated product implanted with solder balls during and after the singulation process. Alternatively, the ball-implanting process for implanting the conductive elements 46 such as solder balls on the substrate 40 can be performed after completing the singulation process of the substrates 40.

For the chip-stacked semiconductor packages integrated with heat sinks fabricated by the foregoing processes, heat produced from the first and second chips 41, 42 can be dissipated through the heat sinks 43, and the attachment between the heat sinks 43 and the chips 41, 42 is performed in a batch-type manner, thereby simplifying the fabrication processes, shortening the fabrication time, and reducing the costs.

Figure 5A:
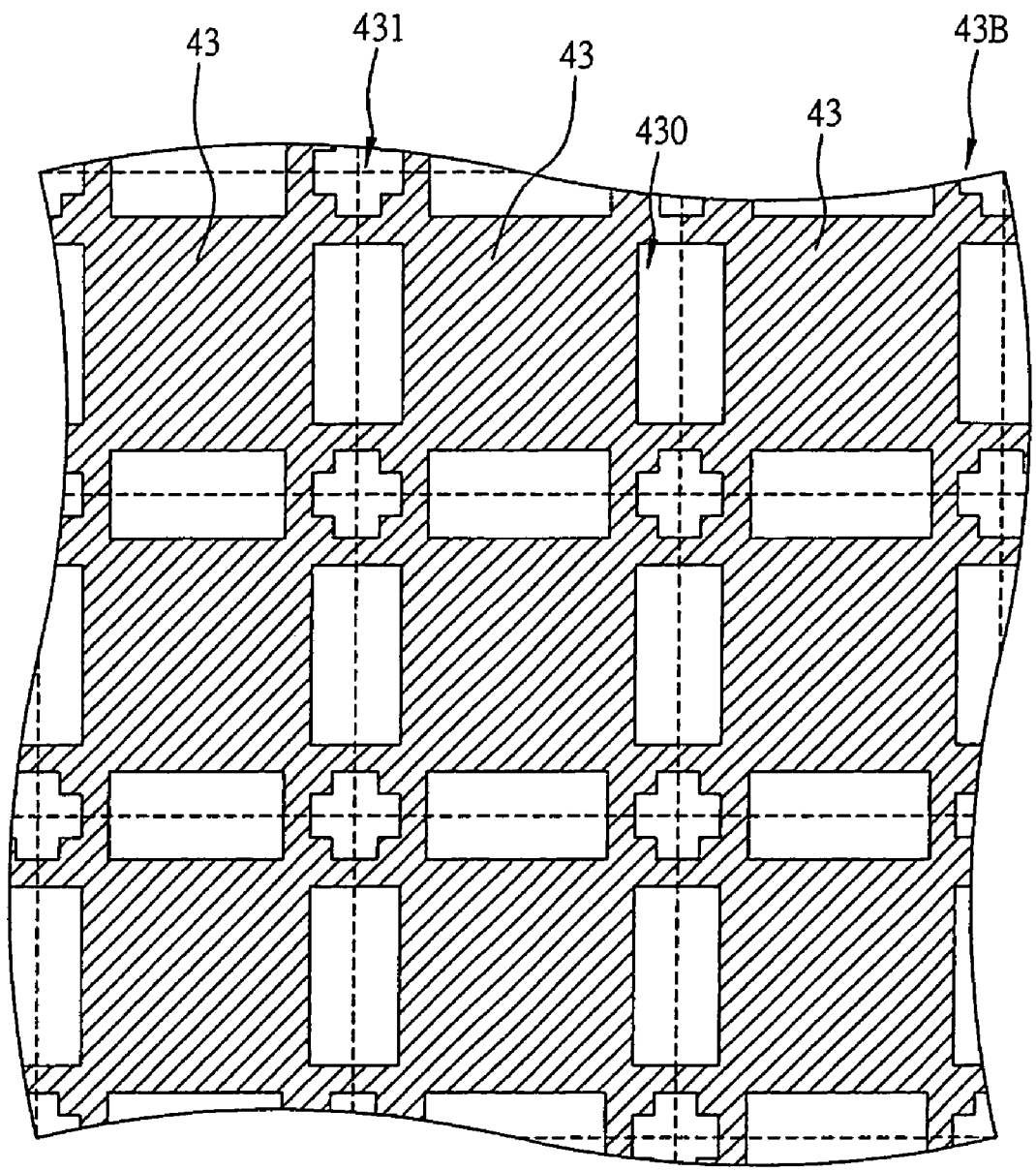
FIGS. 5A to 5C are schematic diagrams showing various heat sink module plates suitable for use in a chip-stacked semiconductor package according to the present invention.
Figure 5B:
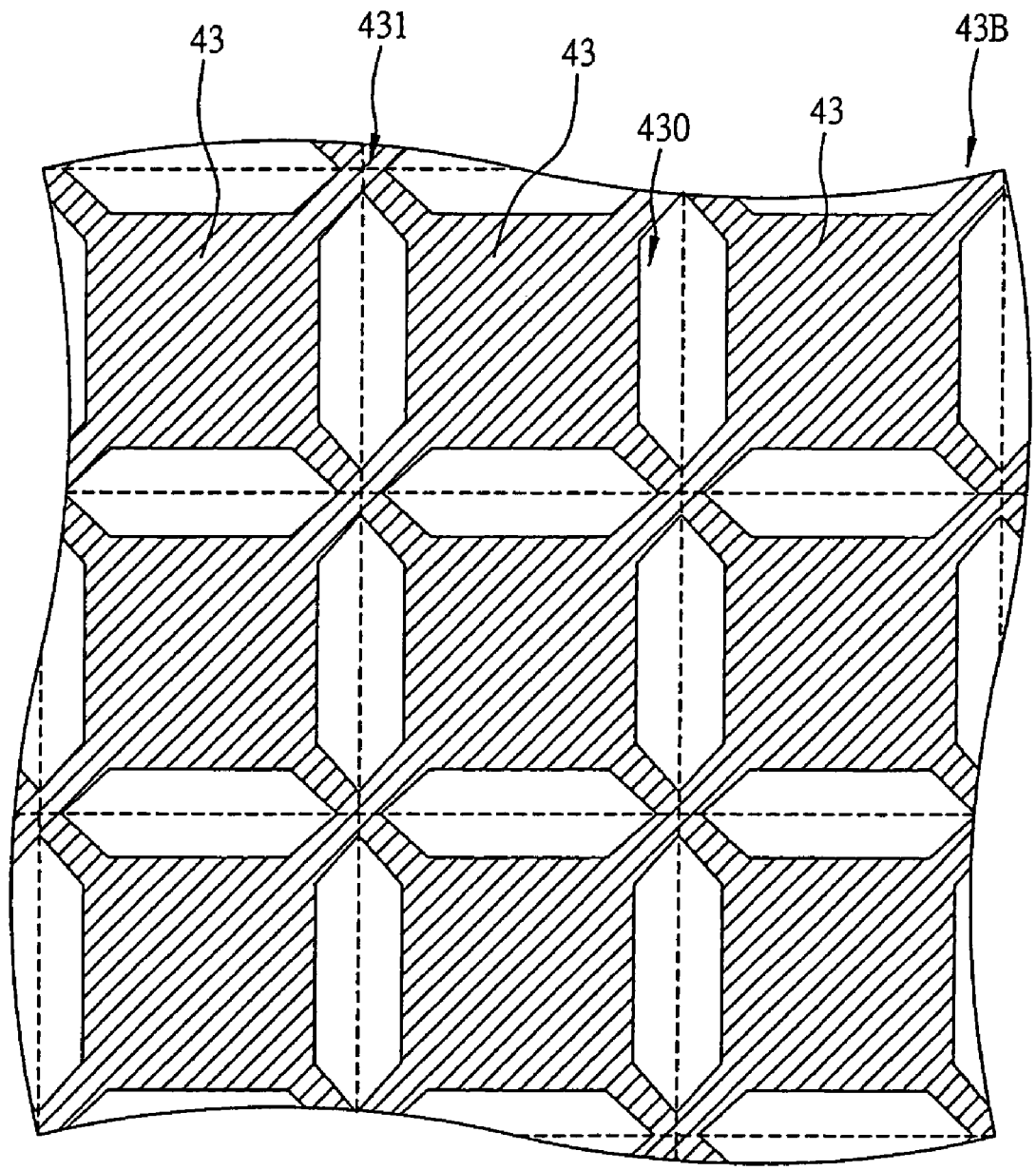
Figure 5C:
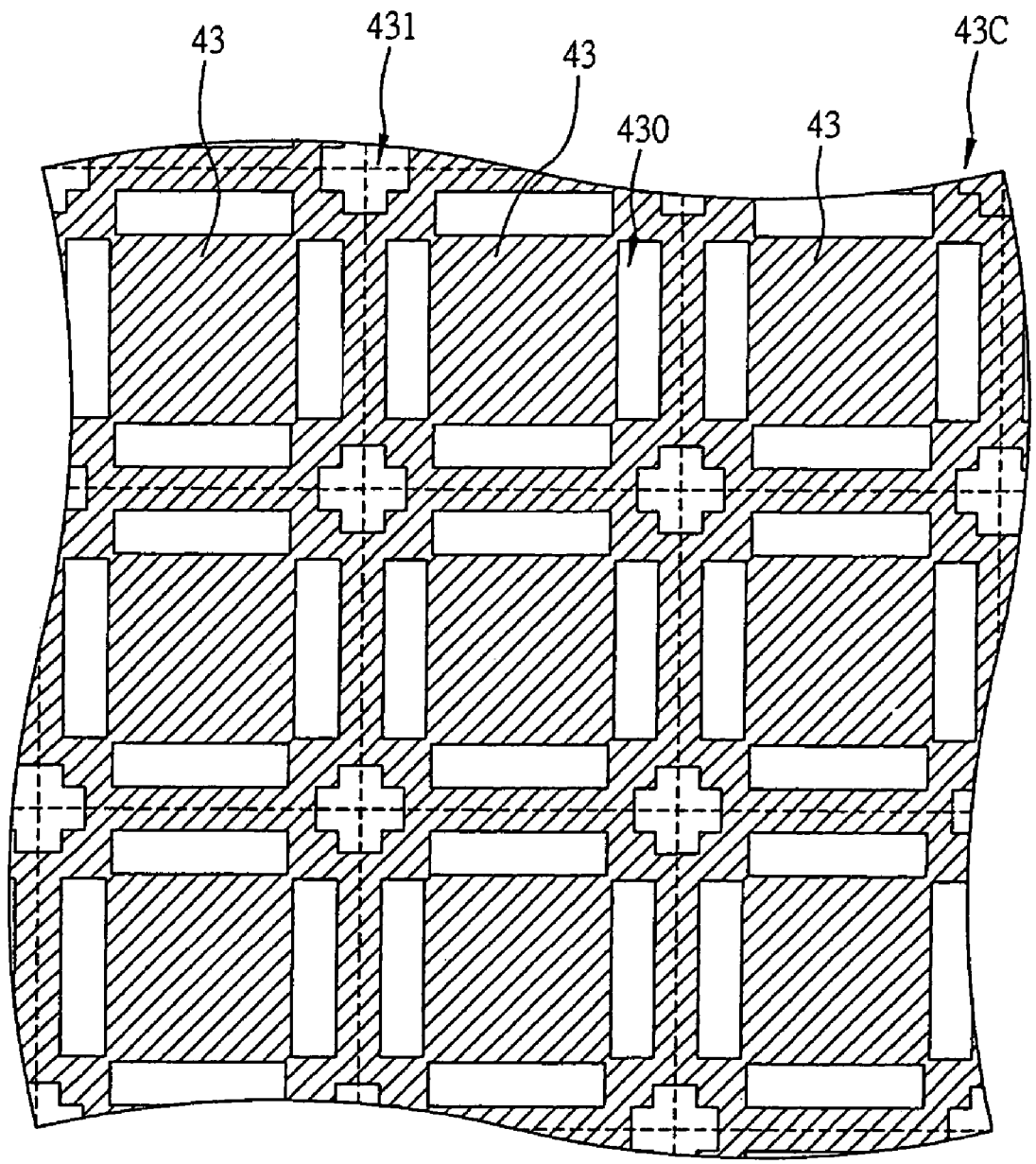

FIGS. 5A and 5B show another heat sink module plate 43B, which can be integrated in the chip-stacked semiconductor packages according to the present invention. As shown in FIG. 5A, besides the through holes 430 formed around each of the heat sinks 43 for accommodating the conductive wires 44, the heat sink module plate 43B is also provided with slots 431 at corners where the adjacent heat sinks 43 are connected to each other. Alternatively, as shown in FIG. 5B, the through holes 430 formed around each of the heat sinks 43 can be increased in size or enlarged. These configurations can further reduce the wearing of the cutting tool during the singulation process. A further heat sink module plate 43C suitably used in the present invention is shown in FIG. 5C, wherein for increasing heat dissipating areas of the heat sinks 43, the through holes 430 formed in the adjacent heat sinks 43 may not communicate with each other if appropriate for the singulation process, such that more heat dissipating areas can be retained for the heat sinks 43 after singulation.

Second Embodiment

Figure 6:
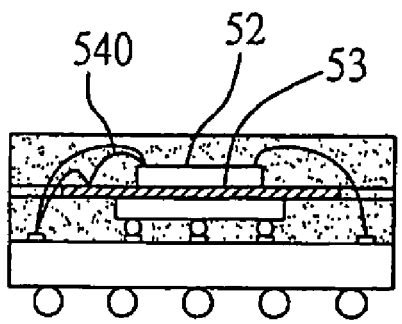
FIG. 6 is a cross-sectional view of a chip-stacked semiconductor package according to a second embodiment of the present invention.

FIG. 6 is a cross-sectional view of a semiconductor package according to a second embodiment of the present invention. The semiconductor package in the second embodiment is fabricated by a method similar to that for the semiconductor package in the first embodiment, with a difference in that in the second embodiment, during a wire-bonding process for a second chip 52, a heat sink 53 serves as a ground plane such that the second chip 52 is electrically connected to the heat sink 53 via grounding wires 540 to thereby improve the electrical performance of the semiconductor package. In order for the heat sink 53 to provide electrical connection with the grounding wires (such as gold wires), silver is plated at positions on the heat sink 53 for connecting the grounding wires so as to improve the bondability between the heat sink 53 and the grounding wires.

Third Embodiment

Figure 7:
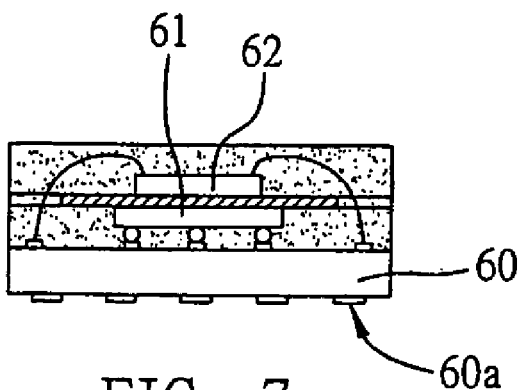
FIG. 7 is a cross-sectional view of a chip-stacked semiconductor package according to a third embodiment of the present invention.

FIG. 7 is a cross-sectional view of a semiconductor package according to a third embodiment of the present invention. The semiconductor package in the third embodiment is fabricated by a method similar to that for the semiconductor package in the first embodiment, with a difference in that a chip carrier used in the third embodiment is a LGA (Land Grid Array) substrate 60, such that a first chip 61 and a second chip 62 can be electrically connected to an external device through a plurality of metal contacts 60a provided on a bottom surface of the LGA substrate 60.

Fourth Embodiment

Figure 8:
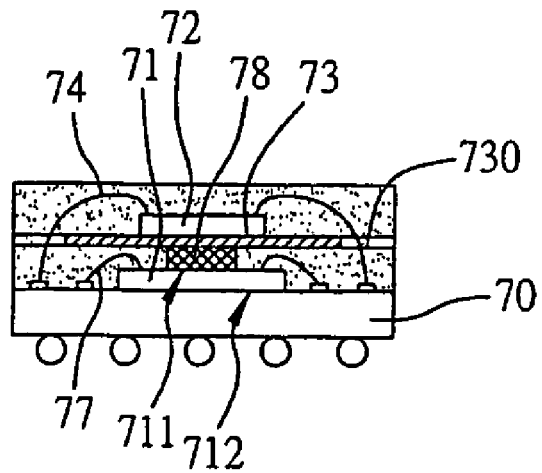
FIG. 8 is a cross-sectional view of a chip-stacked semiconductor package according to a fourth embodiment of the present invention.

FIG. 8 is a cross-sectional view of a semiconductor package according to a fourth embodiment of the present invention. The semiconductor package in the fourth embodiment is fabricated by a method similar to that for the semiconductor package in the first embodiment, with a difference in that in the fourth embodiment, a first chip 71 is electrically connected to a substrate 70 by the wire-bonding technique, wherein a non-active surface 712 of the first chip 71 is mounted on the substrate 70, and an active surface 711 of the first chip 71 is electrically connected to the substrate 70 via conductive wires 77. Moreover, a buffer pad 78 with a CTE similar to that of the first chip 71 is provided on the active surface 711 of the first chip 71 at a position not interfering with the bonding of the conductive wires 77. A heat sink 73 formed with through holes 730 is attached to the buffer pad 78. A second chip 72 is disposed on the heat sink 73 and is electrically connected to the substrate 70 via conductive wires 74 penetrating the through holes 730.

The size of the buffer pad 78 is restricted within a range that would not interfere with the conductive wires 77, and the thickness of the buffer pad 78 should be slightly larger than the height of the top point of the conductive wires 77, such that the heat sink 73 when being attached to the buffer pad 78 would not touch the conductive wires 77. Moreover, the buffer pad 78 can release the thermal stress generated from the heat sink 73 to the first and second chips 71, 72 due to mismatch in CTE under a high-temperature environment, and allows the heat generated by the first and second chips 71, 72 to be transferred to the heat sink 73 through the buffer pad 78. The buffer pad 78 can be made of a dummy die, or a metal material such as copper, aluminum or the like if appropriate.

It should be particularly noted that, in the semiconductor packages and the fabrication methods thereof according to the foregoing embodiments of the present invention, the selection of chip carrier and the electrical connection manner between the chips and the chip carrier may have various combinations and variations, which are all covered by the scope of the present invention.

Therefore, according to the semiconductor package and the fabrication method thereof provided by the present invention, the heat sink can be directly attached to the first chip, such that the heat sink does not require a supporting portion to be attached to the substrate and undesirably occupy space on the substrate, thereby suitable for fabricating a CSP structure. Moreover, a batch-type fabrication technology is employed in the present invention, which uses a chip carrier module plate including a plurality of chip carriers and a heat sink module plate including a plurality of heat sinks with through holes being formed around each of the heat sinks, wherein the through holes formed in the adjacent heat sinks can communicate with each other, such that first chips, the heat sink module plate, and second chips are successively mounted on the chip carrier module plate, wherein the second chips are electrically connected to the chip carrier module plate via conductive wires penetrating the through holes of the heat sink module plate. After a molding process is complete, a singulation process is performed to cut along edges of the chip carriers and the heat sinks, and a cutting tool is moved to pass through the through holes of the heat sink module plate, so as to form a plurality of chip-stacked semiconductor packages integrated with heat sinks. Further since the cutting tool is moved to pass through the through holes of the heat sink module plate, excessive wearing of the cutting tool can be avoided, which is advantageous for performing the singulation process and controlling the singulation cost and also facilitates mass production of the semiconductor packages.

Additionally, the present invention is accomplished by the batch-type method, and after the molding process for completely encapsulating the heat sinks and the chips by an encapsulant, the singulation process is performed. This thereby simplifies the fabrication processes, shortens the fabrication time and reduces the costs, such that the complex and cost-ineffective process of attaching heat sinks to corresponding chips one by one in the conventional semiconductor packaging method can be avoided.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A method for fabricating chip-stacked semiconductor packages, comprising the steps of:

preparing a chip carrier module plate including a plurality of chip carriers, and mounting a first chip on a predetermined position of each of the chip carriers, wherein the first chips are electrically connected to the chip carriers;

providing a heat sink module plate including a plurality of heat sinks, the heat sinks corresponding in size to the chip carriers, wherein a plurality of through holes are formed around each of the heat sinks, and each of the heat sinks is correspondingly attached to each of the first chips;

mounting a second chip on each of the heat sinks, wherein the second chips are electrically connected to the chip carriers via conductive wires penetrating the through holes of the heat sink module plate;

performing a molding process to form an encapsulant for completely encapsulating the first chips, the second chips and the heat sink module plate on the chip carrier module plate; and performing a singulation process to cut along edges of the chip carriers and the heat sinks to form chip-stacked semiconductor packages integrated with the heat sinks.

2. The method of claim 1, wherein the chip carrier is a substrate selected from one of a TFBGA substrate and a LGA substrate, and the chip carrier module plate includes the chip carriers arranged in an array or a strip.

3. The method of claim 1, wherein the first chip is electrically connected to the chip carrier by a flip-chip technique or a wire-bonding technique.

4. The method of claim 1, after mounting and electrically connecting the first chips to the chip carriers, further comprising attaching a buffer pad to each of the first chips, such that the heat sink module plate is subsequently disposed on the buffer pads.

5. The method of claim 4, wherein the buffer pad is made of a dummy die or a metal.

6. The method of claim 1, wherein the heat sink module plate is subjected to a blacking treatment or a browning treatment to provide good adhesion between the heat sink module plate and the encapsulant.

7. The method of claim 1, wherein the through holes formed in the adjacent heat sinks of the heat sink module plate communicate with each other, such that a cutting tool used in the singulation process is moved to pass through the through holes.

8. The method of claim 1, wherein the through holes formed in the adjacent heat sinks of the heat sink module plate are free of communicating with each other.

9. The method of claim 1, wherein slots are formed at corners where the adjacent heat sinks are connected to each other.

10. The method of claim 1, wherein the chip carrier is provided with conductive elements for electrically connecting the first chip and the second chip to an external device.

11. The method of claim 1, wherein the heat sink serves as a ground plane such that the second chip is electrically connected to the heat sink via grounding wires.

* * * * *